United States Patent [19]

Tanaka

[11] 4,142,157
[45] Feb. 27, 1979

[54] TUNING SYSTEM EQUALIZED WITH THE SLOPE FACTOR OF THE TUNING CURVE

[75] Inventor: Akio Tanaka, Chicago, Ill.

[73] Assignee: Zenith Radio Corporation, Glenview, Ill.

[21] Appl. No.: 791,897

[22] Filed: Apr. 28, 1977

[51] Int. Cl.$^2$ .............................................. H04B 1/26
[52] U.S. Cl. ..................................... 325/464; 358/191
[58] Field of Search ............................. 325/420–422, 325/453, 459, 464, 468; 334/11, 14, 15; 358/191

[56] References Cited

U.S. PATENT DOCUMENTS

| | | | |
|---|---|---|---|
| 3,715,687 | 2/1973 | Solender | 325/453 |
| 3,914,696 | 10/1975 | Evans | 325/453 |
| 4,017,800 | 4/1977 | Champagne | 325/464 |

Primary Examiner—Robert L. Griffin
Assistant Examiner—Marc L. Bookbinder
Attorney, Agent, or Firm—Nicholas A. Camasto

[57] ABSTRACT

A tuning system for a television receiver includes a channel number generator coupled to nominal tuning memories, fine tune memories and slope factor memories. The memory outputs are coupled to a corresponding plurality of comparators which are also coupled to counters for deriving pulse-width modulated (PWM) signals corresponding to tuning information stored in the memories. The PWM signals are supplied to a tuning voltage generator where they are combined to produce the tuning voltage for the tuner. The information in the slope factor memories is based upon the slope of the tuning curve corresponding to the selected channel number. The final tuning voltage consists of the nominal tuning voltage combined with the product of the fine tune voltage and slope factor.

22 Claims, 10 Drawing Figures

TUNING SYSTEM EQUALIZED WITH THE SLOPE FACTOR OF THE TUNING CURVE

FIELD OF THE INVENTION

This invention relates generally to tuning systems and in particular to television receiver tuning systems which include a tuner with a voltage controlled oscillator having a non-linear frequency versus tuning voltage response curve or characteristic.

BACKGROUND OF THE INVENTION AND PRIOR ART

The development of electronic tuners, based upon the use of varactor diodes for producing capacitance changes as a function of an applied DC potential, has vastly simplified tuning systems in general, and television receiver tuning systems in particular. In these tuners, the varactor diode exhibits capacitance variations with changes in bias voltage and serves as the variable reactance in an -otherwise- conventional tuned circuit. Electronic tuning systems are gaining increasing acceptance because of their ease of tuning, freedom from RF signal carrying contacts and the versatility afforded the designer in styling the receiver. Their most serious drawbacks are the limited range of diode capacitance change and the non-linear relationship between frequency and bias voltage. The limited range of the diode is circumvented by band switching arrangements in VHF (and separate diodes in UHF) for changing the inductively reactive elements in the tuner stages to enable a limited change in capacitance to produce resonance over a large frequency range. The non-linearity of the varactor diode bias voltage-versus-frequency characteristic poses more difficult problems, especially in systems using conventional tuner addressing approaches.

Further complications in tuning system design were introduced a few years ago when the Federal Communications Commission decreed "equal tuning" (or tuning parity) between VHF television channels and UHF television channels. The ultimate goal is for the viewer to experience the same ease (or degree of difficulty) in tuning any television station, whether UHF or VHF. There is thus a need for readily "equalizing" the tuning characteristic of varactor diodes whereby equal tuning information increments will be translated into equal frequency changes irrespective of the particular portion of the tuning characteristic at which the increment occurs.

At the outset, it should be understood that the terms "equalizing" and "equalized" have been greatly abused in the art. Generally speaking, any attempt at making the tuning curve seem more linear has been called equalizing. Thus a single resistor may be switched between the VHF and UHF bands and the system may be referred to as equalized. In the discussion of the invention, true equalization is meant in the sense that equal tuning information increments give rise to equal frequency changes.

Some recent, all-electronic tuning systems inherently produce "equal ease" tuning. Specific reference is made to U.S. Pat. No. 3,961,266, issued to Akio Tanaka and assigned to Zenith Radio Corporation, which is directed to an electronic tuning system having a "tuning window". Its disclosure describes a tuner with the local oscillator frequency being digitally sampled and converted into the two digit channel number and intrachannel frequency increment corresponding to the FCC frequency allocation. The derived channel number (and intrachannel increment) is digitally compared with the desired channel number and a preselected intrachannel increment to determine when proper tuning exists. The system uses modulo 6 counting and consequently a one count change in the modular residue corresponds to a 1MHz change in oscillator frequency, independent of the tuning curve. Equal tuning is always provided in that system because the tuning voltage, per se, is not involved except as the driving means for the oscillator. The system doesn't provide for fine tuning.

Less sophisticated systems do not, in general, produce equal tuning because conventional tuners do not have linear tuning curves and changing the bias or tuning voltage by a given increment will not result in equal frequency changes. As a practical matter, for abrupt junction varactor diodes used in television receiver tuning systems, a tuning voltae change of one volt in the vicinity of VHF channel 2 may produce a 6MHz change in frequency whereas a similar tuning voltage change in the vicinity of VHF channel 6 may produce a ½MHz change.

Another desirable characteristic for a viewer is "equal tuning feel". By this is meant that, if for example, the range of fine tuning is one-half turn of the control knob fo VHF channel 2, it should be one-half turn for VHF channel 6. In many receivers, fine tuning of UHF channels is more difficult than fine tuning of VHF channels. As will be seen, the invention enables a viewer to perceive "equal tuning feel" even for UHF channels. Also tuning confusion may be materially reduced since the effect of the fine tuning control may be limited to less than ± one channel and preclude tuning to a "wrong" channel. In this context, a wrong channel is one for which the receiver tuning readout or channel indicator displays a channel number other than that assigned to the actual received signal. Similarly in an environment in which counters produce the tuning voltage, each count of the counter may be readily made to correspond to an equal frequency change in the oscillator.

While the invention will be described in the environment of a television system and indeed is contemplated to provide very attractive benefits therein, it is not to be so restricted. As will be apparent to those skilled in the art, the inventive method and apparatus may be applied to tuning systems generally - where there is a non-linear voltage to frequency characteristic.

One ready example is that of providing Automatic Frequency Control (AFC) for the tuner when the receiver has been tuned to a desired channel. The subject of AFC's is quite complex in itself. Suffice it to say that the "pull-in" and "lock-in" of the AFC system is of great importance and that invariably the designer must make a number of compromises in an effort to produce an optimum arrangement. Since AFC is in reality a form of "continuous" fine tuning, it should be apparent that the requirements of the AFC circuit may be relaxed considerably by providing equalization over the television spectrum. There are a number of approximate AFC equalization schemes in the art, most of which involve interposing dividing resistors, tailored to selected channels or channel groups, to proportion the AFC voltage in accordance with the tuning voltage magnitude. While the correction obtained is in the right direction it is not related to the slope of the tuning curve. Thus it is well-known to apportion the AFC voltage, especially with respect to signals in the VHF and UHF bands, and the same circuitry can be readily adapted for approtioning the fine tuning voltage.

U.S. Pat. No. 4,005,256 discloses an AFC circuit for a television receiver. The circuit includes bias means for providing one of a plurality of bias voltages each corresponding to a particular channel to be received, an AFC means and a signal combining circuit for application to a voltage controlled tuner. The signal combining circuit may include either; a combination of first, second and third resistance means to produce a variation in the amount of error voltage coupled to the tuning means in accordance with the bias voltage; or a first resistance means and a second non-linear resistance means for doing substantially the same thing. The objective of the patented circuit is to provide a substantially constant automatic frequency control pull-in range throughout the frequency range of interest despite the non-linear frequency versus voltage tuning characteristic of the tuner. As can be readily seen, the AFC voltage is truly equalized, if at all, at only a very few points.

U.S. Pat. No. 3,962,643 shows an "equalized" AFC system for VHF channels. Here again the AFC voltage is apportioned based upon the tuning voltage magnitude and represents a coarse approximation rather than true equalizing.

The art has also pursued digital memory type tuning systems. U.S. Pat. No. 3,990,027 dicloses a memory block for storing, in digital form, the tuning voltages for each receivable television channel. The memory block is addressed by counters in accordance with the channel number of the desired signal. The channel tuning voltages are adjustable for precise tuning and on readout are converted by a digital to analog (D/A) converter into a tuning voltage for the tuner. Suitable band decoding is also performed to compensate for the particular frequency band in which the channel lies. Such systems are common but do not provide equalized fine tuning or AFC.

The basic distinction between the so-called equalized systems in the art and the method and apparatus of the invention is that the art by-and-large uses the magnitude of the tuning voltage for determining the "equalization" value, whereas the invention uses the slope of the tuning voltage-versus-frequency characteristic to determine the weight to be given to the tuning voltage increment.

In this respect prior art U.S. Pat. No. 3,878,466 issued to Melvin Hendrickson and assigned to Zenith Radio Corporation, discloses a complex electro-mechanical system with a sequentially connected plurality of resistors having contact junctions presenting the end tuning voltages for each channel. A potentiometer is sequentially switchable thereover for channel selection and produces true equalized fine tuning to the extent that the resistors are selected to match the tuning characteristic. However the slope factor information is not available and is of no value for equalizing AFC and the fine tuning range is arbitrarily fixed at ± one channel.

On the contrary the inventive method overcomes the problem in the prior art and paves the way for economical all-electronic, all-channel equalized tuning systems.

SUMMARY OF THE INVENTION

In accordance with the invention a method of operating a voltage controlled tuner having a non-linear tuning voltage versus frequency characteristic includes the steps of developing first tuning information related to a first tuning voltage corresponding to a selected area of the tuning characteristic, proportioning second tuning information by a factor related to the slope of the tuning characteristic in the selected area and combining the first and second tuning information to produce a tuning voltage.

The present invention is especially suited for digital circuitry. In essence, memories are provided for information related to (1) a nominal tuning voltage, (2) a slope factor and (3) a fine tuning voltage for each television channel. The memories are simultaneously channel-number-addressed and the fine tuning memory is electrically alterable to accommodate viewer preferences or variations in transmitted signal. The memories and counters supply comparators, the outputs of which are pulse width modulated (PWM) signals indicative of the memories' contents. The information corresponding to a nominal tuning voltage is combined with the information related to a fine tuning voltage (which has been proportioned by the slope factor). The degree of tuning accuracy or resolution desired is a function of the memory size — i.e., more memory bits corresponds to a greater frequency resolution. By controlling the weight of the slope factor, the fine tuning range of the system may be easily restricted to preclude display of erroneous channel numbers, for example, or to minimize viewer confusion.

It should be further noted that the disclosed apparatus is generalized to illustrate the fundamental aspects of the invention. To that end the nominal tuning memories and slope factor memories have 12 bits per channel and the fine tuning memories have 8 bits per channel.

In application Ser. No. 807,627, filed June 17, 1977 a so-called "first derivative" system is disclosed in which the nominal tuning information for any channel is determined from nominal tuning information for a base channel in its frequency band and successive summations of the slope factors or tuning information increments from the base channel to the desired channel. This system results in substantial savings of memory. In application Ser. No. 866,876, filed Jan. 3, 1978 a so-called "second derivative" system is disclosed in which the nominal tuning information is similarly derived except that the slope factors used are the "slopes of the slope" of the tuning curve with still further reductions in memory content. These systems, while extensions of the present invention, form no part of the present invention.

OBJECTS OF THE INVENTION

The principal object of this invention is to provide an improved tuning system and method.

Another object of this invention is to provide a novel tuning system having a tuner with a non-linear tuning voltage versus frequency characteristic and equalized tuning.

A further object of this invention is to provide a novel television tuning system with equalized tuning.

BRIEF DESCRIPTION OF THE DRAWINGS

Further objects and advantages of this invention will be apparent from reading the following specification in conjunction with the drawings in which.

DESCRIPTION OF THE PREFERRED EMBODIMENT

Very attractive benefits are immediately apparent when the inventive method and apparatus are applied to a television receiver and the preferred embodiment is so directed. To avoid unnecessary complexity, the television receiver itself is not shown, only the tuner being indicated.

Figure 1:
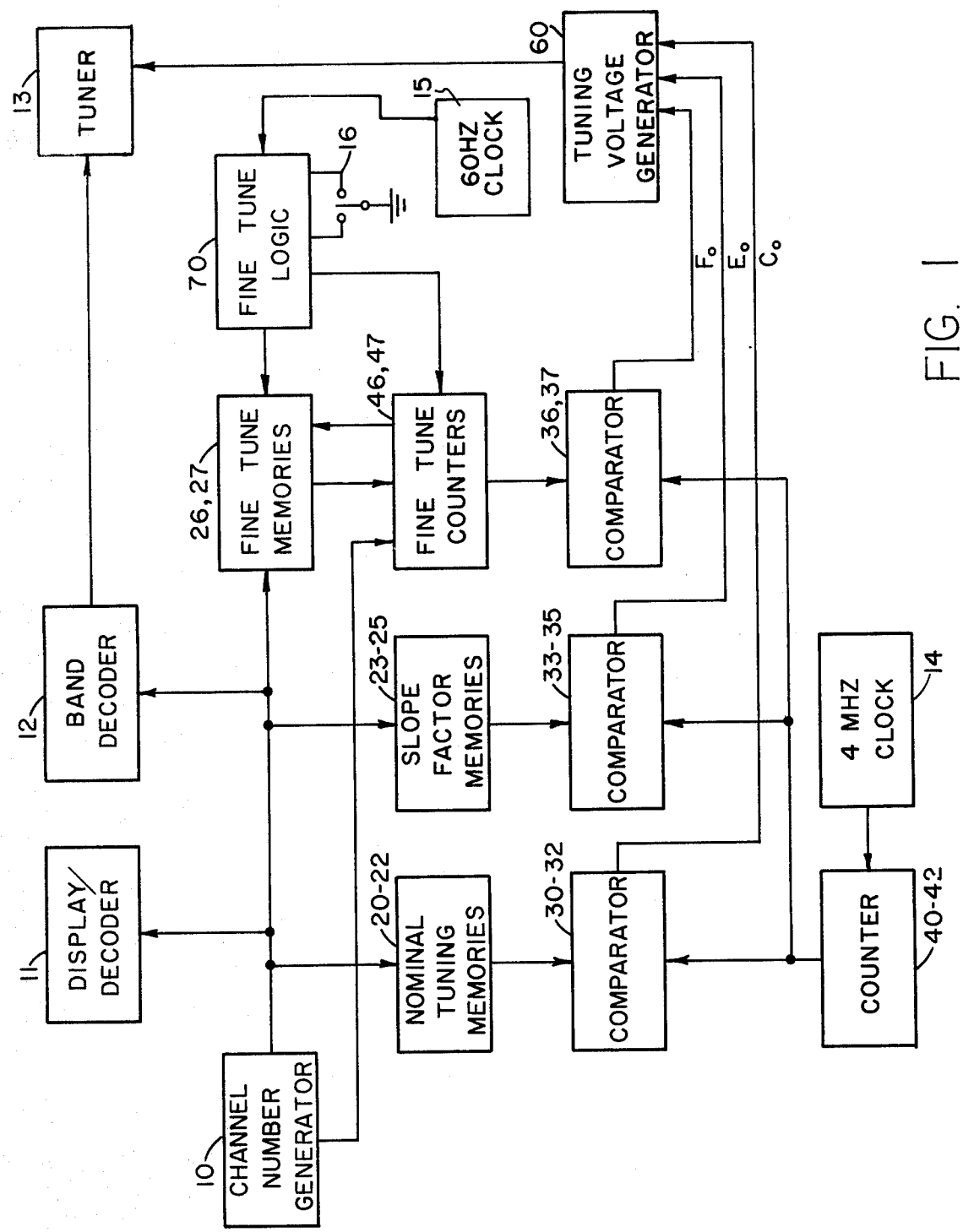
FIG. 1 is a block diagram of a television tuning system incorporating the invention.

In FIG. 1 a channel number generator 10 supplies a display/decoder device 11, a band decoder 12, nominal tuning memories 20–22, slope factor memories 23–25 and fine tune memories 26–27. The nominal tuning memories and slope factor memories will normally be factory programmed for the tuning curve of the tune and thus not be viewer alterable. The fine tune memories are viewer adjustable. For a "no-fine tune system", fine tuning may take the form of an AFC circuit. Channel number generator 10 generates and supplies a binary coded decimal (BCD) output indicative of the number of the television channel selected for viewing. Number generator 10 may comprise a standard calculator keyboard and BCD encoding circuitry, an accessible memory, a switch or a counter. Number generator 10 also supplies a Channel Change Initiate (CCI) or READ signal to fine tune counters 46–47. The READ signal may be a pulse produced upon change in the units or tens counters as illustrated in Ser. No. 621,911 filed Oct. 14, 1975 now U.S. Pat. No. 4,023,109. Display/decoder device 11 is in all respects conventional and preferably incorporates a two-digit electronic arrangement for displaying the channel number from channel number generator 10 in digital form. Similarly band decoder 12 is well-known in the art and includes circuitry for applying appropriate band switching voltages to a tuner 13 in accordance with the number produced by channel number generator 10.

A 4MHz clock 14 is connected to counters 40–42, the outputs of which are coupled to the inputs of a plurality of comparators 30–37, the other inputs of which are connected to memories 20–25 and fine tune counters 46–47. Comparators 30–32 compare the contents of nominal tuning memories 20–22 with the outputs of counters 40–42 and generate an output signal $C_o$. The level of $C_o$ is either high or low depending upon whether the counter count is less than the memories' contents. Comparators 33–35 compare the contents of slope factor memories 23–25 and the outputs of counters 40–42 and produce an output signal $E_o$. Comparators 36, 37 compare the contents in fine tune counters 46, 47 with the outputs of counters 40–42 and supply an output signal $F_o$. A fine tune logic circuit 70 is supplied with a 60Hz clock signal from a clock 15 and provides a Write signal for fine tune memories 26, 27, and a Clock signal and an Up-Down (U/D) signal for fine tune counters 46, 47. A single-pole double-throw switch 16 is connected to fine tune logic 70 and controls the direction of operation of fine tune counters 46, 47. Fine tune memories 26, 27 are coupled to fine tune counters 46, 47. The fine tune memories are electrically alterable by operation of switch 16. The output signals $F_o$, $E_o$ and $C_o$ are applied to a tuning voltage generator 60, which in turn derives the tuning voltage for tuner 13.

Figure 2A:
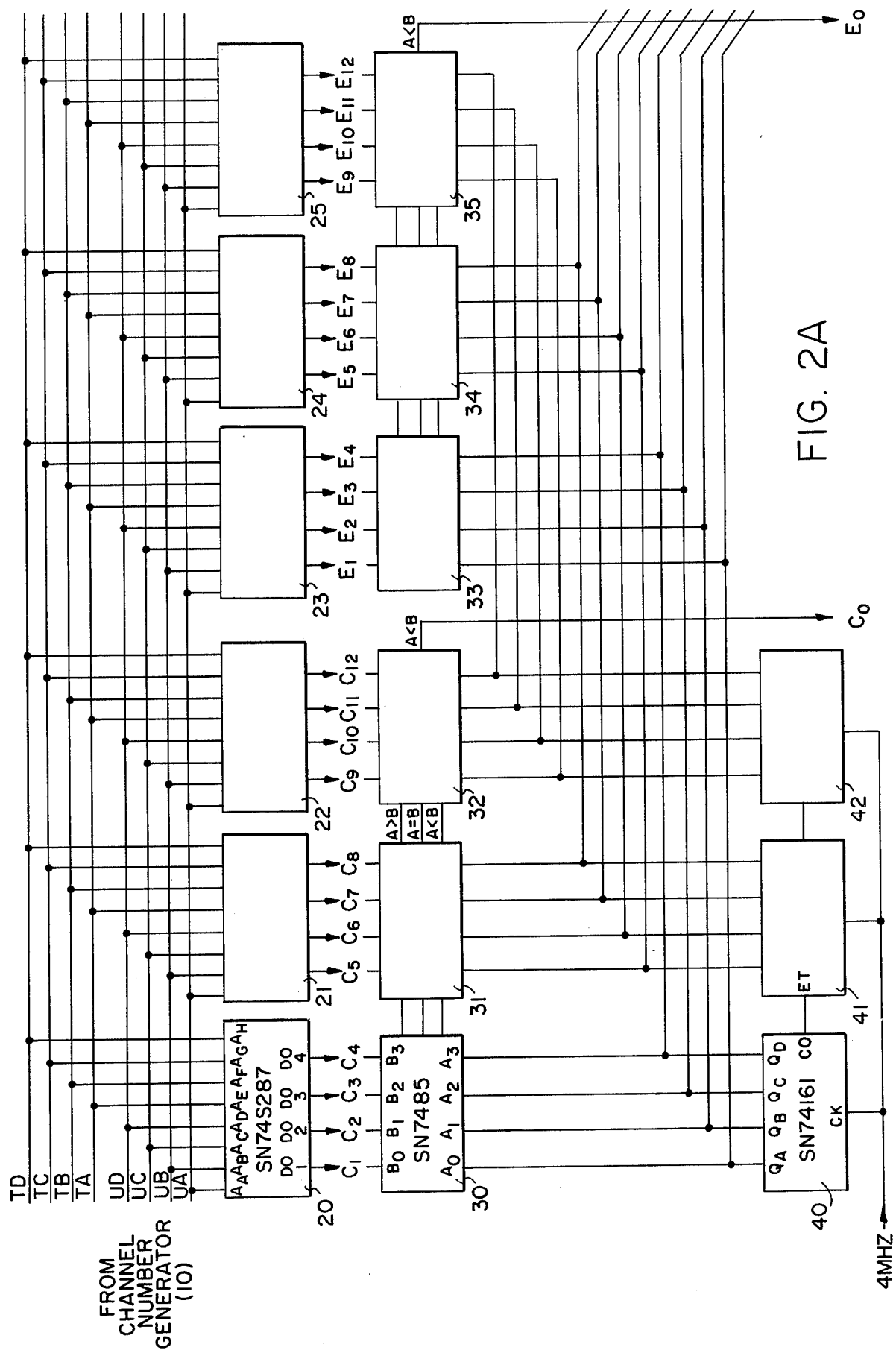
FIGS. 2A and 2B are schematic diagrams of the memories, comparators and counters of FIG. 1.
Figure 2B:
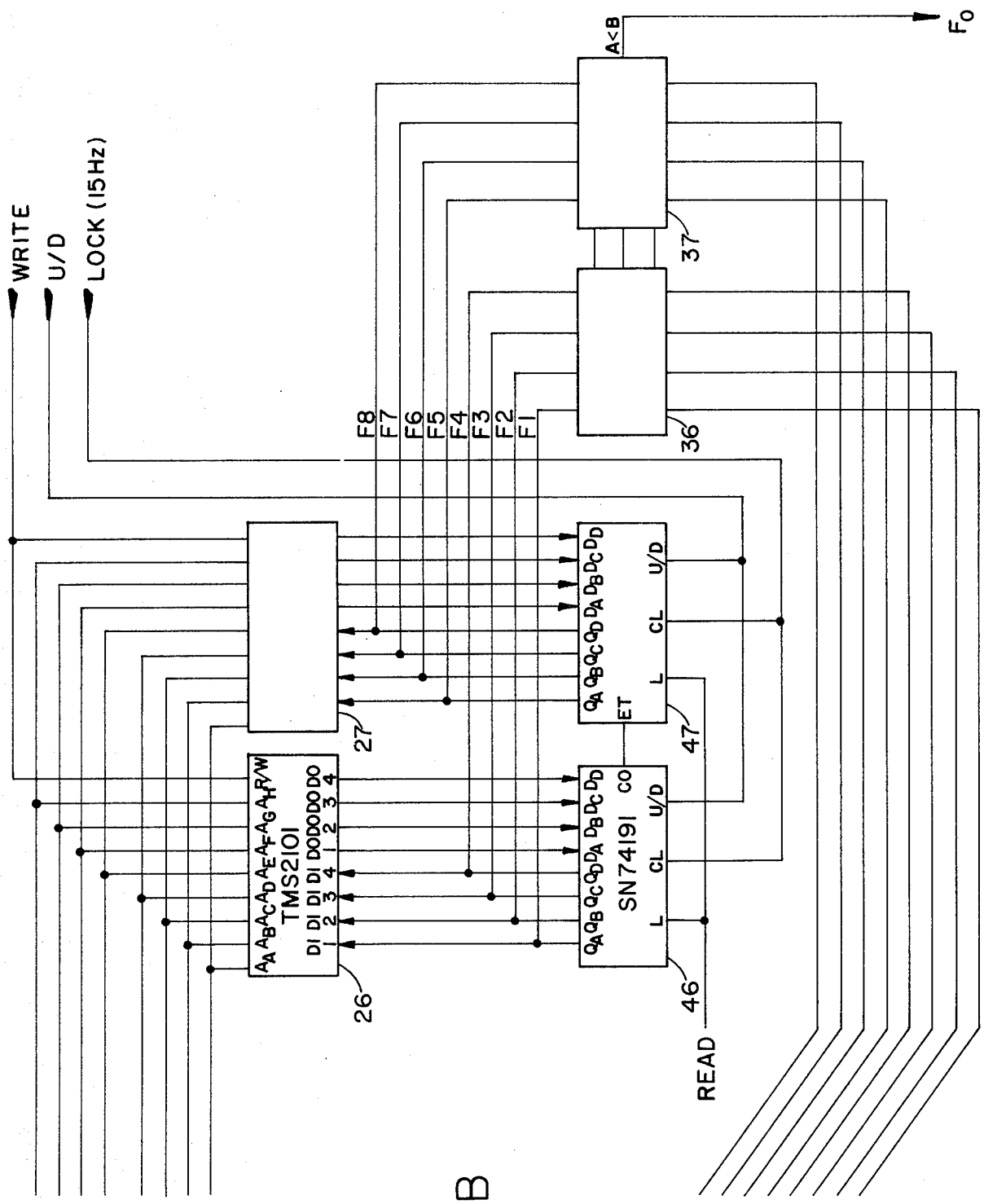

FIGS. 2A and 2B should be positioned adjacent to each other with the lines extending from the right hand edge of FIG. 2A connected to the corresponding lines extending from the left hand edge of FIG. 2B. The memories, comparators and counters are commercially available in integrated circuit form and bear terminal designations identical to those of the commercial product. (In TMS2101, $A_0$---$A_7$ are referred to as $A_A$---$A_H$ for consistency among the memories.) It will be appreciated by those skilled in the art that the memories shown have 12, 12, and 8 bits, respectively of information per channel, which may be more capacity than is required for the circuit. In a commercial implementation, the memories would be custom made with sufficient capacity for the degree of tuning accuracy desired. Memories 20–25 are available under type designation SN74S287, comparators 30–37 under type designation SN7485, counters 40–42 under type designation SN74161, fine tune counters 46, 47 under type designation SN74191 and fine tune memories 26 and 27 under type designation TMS2101, all from Texas Instruments Corp.

Four leads labelled TD, TC, TB and TA, respectively, extend from channel number generator 10 and carry the BCD information corresponding to the tens digit of the selected channel number. Similarly four other leads labelled UD, UC, UB and UA carry the BCD information corresponding to the units digit of the channel number generated. Leads UA–UD are connected to input terminals $A_A$–$A_D$ and leads TA–TD are connected to input terminals $A_E$–$A_H$ respectively, of nominal tuning memories 20–22, slope factor memories 23–25 and fine tune memories 26, 27. The memories 20–25 are in turn coupled to comparators 30–35, respectively. Fine tune memories 26, 27 have their data-output terminals ($DO_1$–$DO_4$) coupled to the $D_A$–$D_D$ input terminals of fine tune counters 46, 47. The $A_0$–$A_3$ inputs of the comparators are coupled to the $Q_A$–$Q_D$ outputs of counters 40–42. The counters are driven from the 4MHz clock.

Comparators 30, 31 and 32 are serially coupled together with output signal $C_o$ being taken from comparator 32. Similarly comparators 33, 34 and 35 are serially coupled with output signal $E_o$ being taken from comparator 35. Fine tune comparators 36 and 37 are serially coupled with output signal $F_o$ being supplied from the latter.

Since the fine tune memories are alterable, the fine tune counters can set the memories. Outputs $Q_A$–$Q_D$ of fine tune counters 46, 47 are connected to input terminals $DI_1$–$DI_4$ of fine tune memories 26, 27 and input terminals $B_0$–$B_3$ of comparators 36, 37. A Write signal is coupled to the R/W terminals of fine tune memories 26 and 27, a U/D signal coupled to the U/D terminals of the fine tune counters 46 and 47 and a 15Hz Clock signal coupled to the CL terminals of the counters.

The $DO_1$–$DO_4$ outputs of memories 20–25 are connected to corresponding inputs $B_0$–$B_3$ of comparators 40–46 and bear lead designations $C_1$14 $C_4$ for comparator 30, $C_5$–$C_8$ for comparator 31, $C_9$–$C_{12}$ for comparator 32, $E_1$–$E_4$ for comparator 33, $E_5$–$E_8$ for comparator 34, $E_9$–$E_{12}$ for comparator 35. The $Q_A$–$Q_D$ output of fine tune counters 46, 47 are connected to corresponding inputs of comparators 36, 37 and bear lead designations $F_1$–$F_4$ for comparator 36 and $F_5$–$F_8$ for comparator 37. It will be recognized that the "C" leads are related to the output signal $C_o$, the "E" leads are related to the output signal $E_o$ and the "F" leads are related to the output signal $F_o$.

In operation, the memories are individually and simultaneously addressed by the selected channel number from the channel number generator. The memories are set to present preselected informations at their output terminals in accordance with the channel number address, which informations are applied to one set of input terminals of the respective comparators. The other set of input terminals of the comparators is connected to the output terminals of the counters which count and are cycled at a predetermined clocking rate. During counting, output signals $C_o$, $E_o$ and $F_o$ are high when the counter state is less than the memory content and low when equal to or greater than the memory content. In practice the counting interval is about one millisecond and the length of time that the output signals remain at a high logic level is indicative of the number in the memory. When the comparator determines that the counter output is equal to or greater than the memory content, its output voltage is low and the duration of the high logic level pulse is directly indicative of the memory content. (This aspect of the circuitry is in the art and forms no part of the invention.) Thus the $C_o$, $E_o$ and $F_o$ signals at the outputs of each of the comparator groups are PWM signals having duty cycles proportional to the digital information stored in the memories.

In the fine tune section, additional counters are employed for electrically altering the corresponding memories' contents in accordance with viewer preferences. The fine tune memories are interrogated each time a READ signal is received via the fine tune counters. The comparators operate in the same manner as the comparators for the nominal tuning memories and slope factor memories. The fine tuning information is automatically updated in the memories by the fine tune logic, responsive to operation of switch 16.

Figure 3:
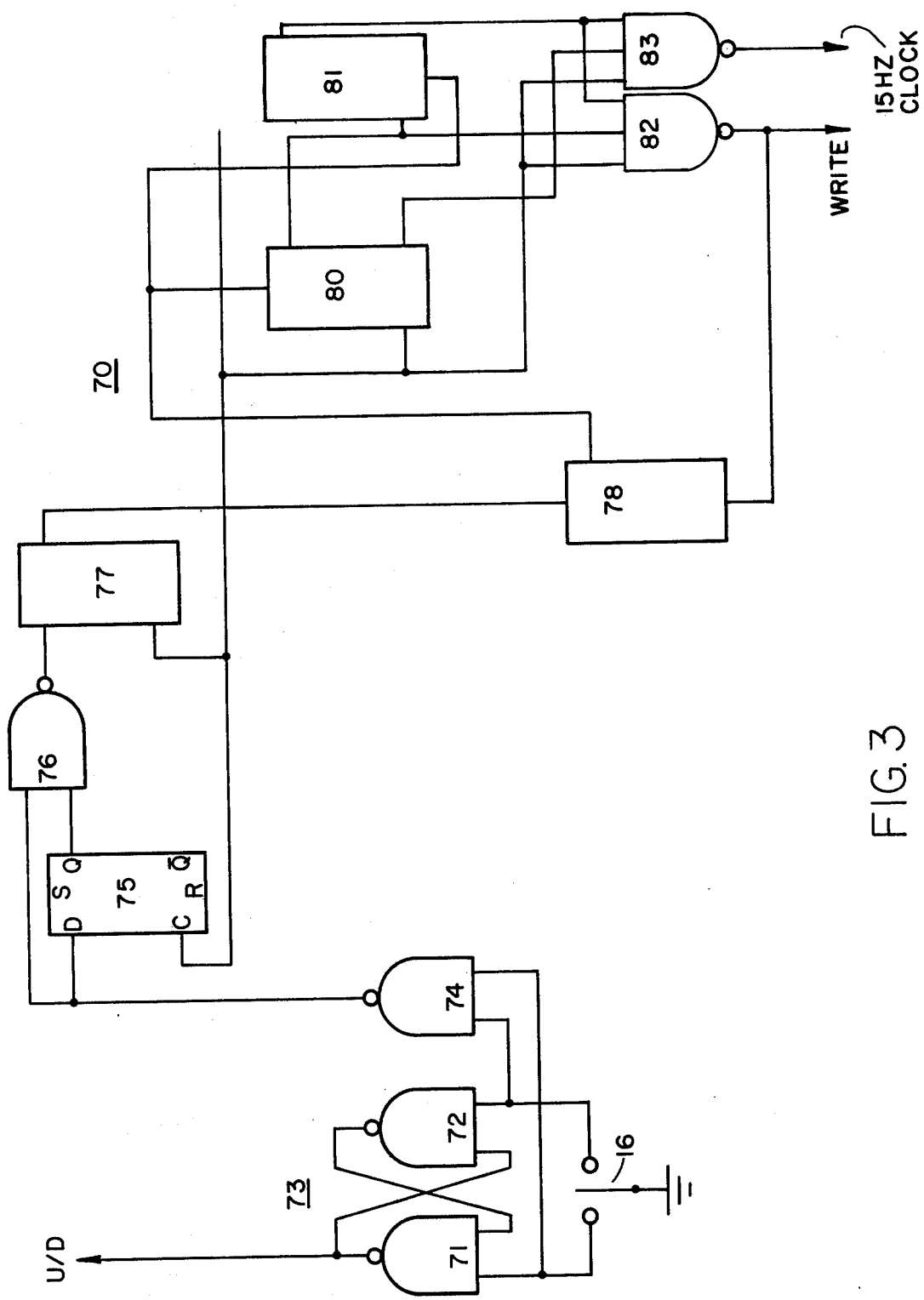
FIG. 3 is the fine tune logic circuit of FIG. 1.

In FIG. 3 fine tune logic circuit 70 includes a pair of cross-connected NAND gates 71 and 72, each having one input connected to a pole of up-down switch 16. The second input of each of NAND 71 and 72 is connected to the output of the opposite NAND. Together they form an RS flip flop (FF) 73 for producing and maintaining the U/D signal at the output of NAND 71. The U (up) signal is represented by a low logic level and the D (down) signal is represented by a high logic level. The two poles of switch 16 are also connected to respective inputs of a NAND 74, the output of which is connected to the D terminal of a D type FF 75 and the input of a NAND 76. The Q output of FF 75 is connected to the remaining input of NAND 76, the output of which is connected to D of a FF 77. A 60Hz clocking signal is connected to the C inputs of FF's 75, 77 and 80 and to an input each of a pair of NAND's 82 and 83. Q of FF 77 is connected to the set terminal (S) of a FF 8, the $\overline{Q}$ of which is connected to S of FF 80 and the reset terminal (R) of a FF 81. Q of FF 80 is connected to C of FF 81 and to the second input of NAND 82. $\overline{Q}$ of FF 80 is connected to the second input of NAND 83. Q of FF 81 is connected to the last inputs of NAND's 82 and 83. The output of NAND 82 carries the Write signal and is coupled to R of FF 78. The output of NAND 83 constitutes a clock signal at a 15Hz frequency.

RS FF 73 establishes and maintains the proper level at the output of NAND 71 to indicate whether an up or down channel change command was given. NAND 74 detects when switch 16 has been activated (in either direction). FF's 75 and 77 and NAND 76 serve as a "deglitch" circuit to preclude contact bounce from falsely actuating the system. FF's 80 and 81 are a divide-by-four counter with NAND's 82 and 83 detecting two states thereof. FF 78 insures that the count-write cycle is completed. The connection of Q of FF 78 to S of FF 80 and R of FF 81 insures starting from the same state each time.

Figure 4:
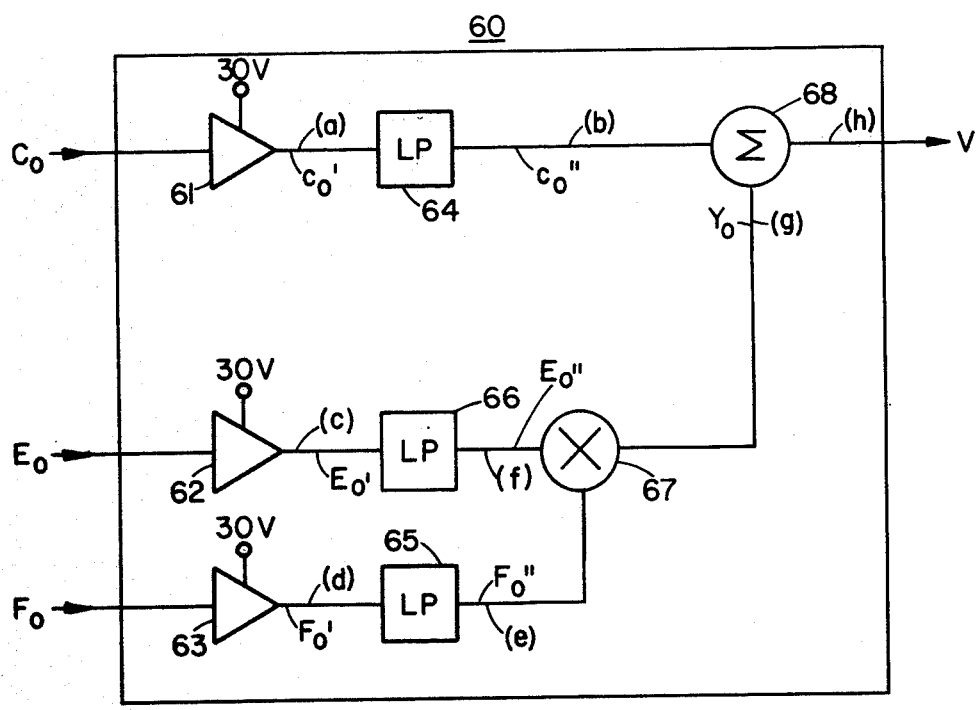
FIGS. 4 and 5 are diagrams of two implementations of the tuning voltage generator of FIG. 1.

FIG. 4 depicts one implementation of tuning voltage generator 60. The PWM signals $C_o$, $E_o$ and $F_o$ are respectively coupled through a plurality of buffer amplifiers 61, 62 and 63 to produce level shifted PWM signal $C_o'$, $E_o'$ and $F_o'$. Such amplifiers are commonly known in the art and serve to amplify square wave input signals, for example, to the level of the indicated source voltage — in this instance 30 volts. For example, a Texas Instruments type SN7407 device with a "pull-up" resistor to 30 volts may be used. $C_o'$, $F_o'$ and $E_o'$ are supplied to low pass filters 64, 65 and 66 where they are converted into steady state voltages $C_o''$, $F_o''$ and $E_o''$ respectively. $F_o''$ is used as the source for a multiplier 67 to which $E_o''$ is supplied, producing an output signal $Y_o$. $Y_o$ is fed along with $C_o''$ to a summation circuit 68. The final tuning voltage V is produced at the output of operational amplifier summation circuit 68 for application to the tuner. Multiplier 67 is also well-known in the art and may be type MC1594L available from Motorola Inc.

Figure 6:
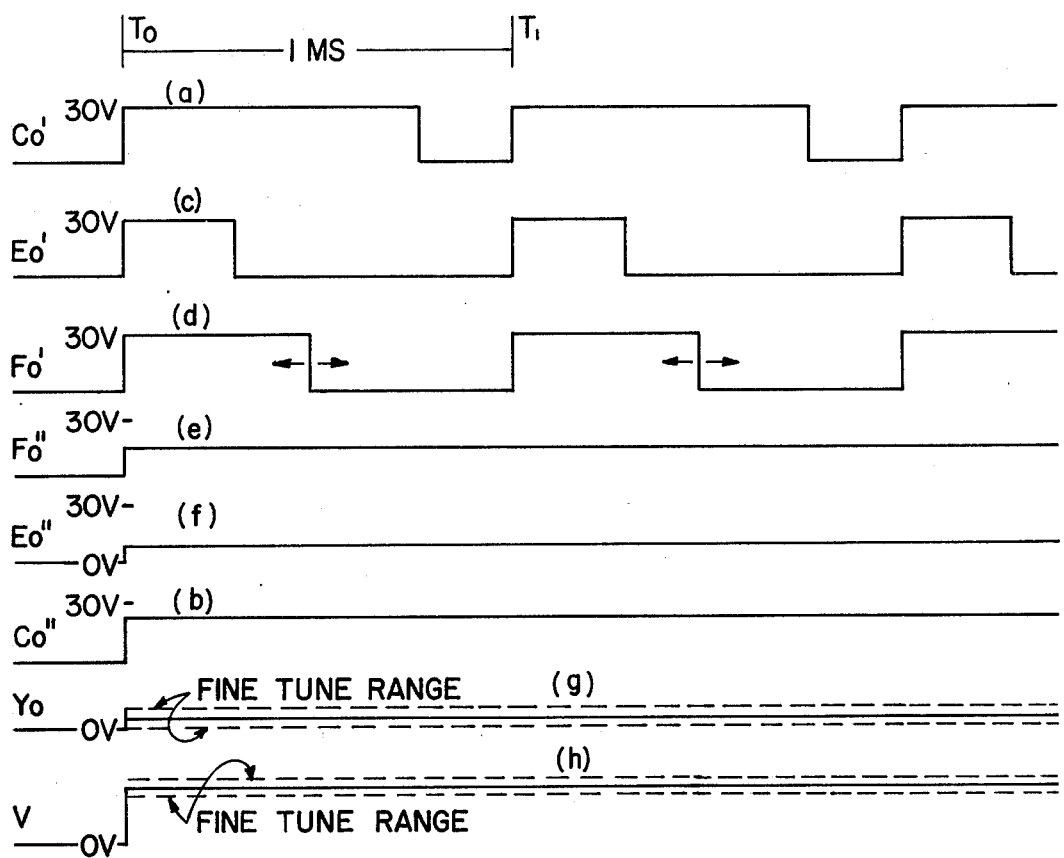
FIGS. 6 and 7 display wave forms of the signals present in the tuning generator implementations of FIGS. 4 and 5.

Reference to FIG. 6 will help clarify circuit operation. The curves indicated by letters (a) through (h), (and correspondingly marked on the diagram of FIG. 4), indicate the various waveforms of representative signals. $C_o'$ is a pulse of 30 volts amplitude. For the assumed condition, it extends for the major portion of the $T_o$-$T_1$ time cycle (approximately one millisecond in duration). $E_o'$ is a pulse of similar amplitude but (for the assumed condition) of more limited duration. Similarly $F_o'$ has a 30 volt amplitude but a variable duration, as indicated by the oppositely-directed horizontal arrows. For any given channel $C_o'$ and $E_o'$ are fixed quantities corresponding to nominal tuning and slope factor information stored in memories 20-22 and 23-25, respectively, of FIG. 2A. The duration of $F_o'$ is determined by the digital information stored in memories 26 and 27 of FIG. 2B. The $E_o''$, $F_o''$ and $C_o''$ curves are believed self-explanatory and consist of DC v-ltages of an amplitude (between 0 and 30 volts) dictated by the duty cycles of the respective $E_o'$, $F_o'$ and $C_o'$ signals. $Y_o$ is $F_o''$ that has been multiplied by $E_o''$. The $Y_o$ signal has a limited amplitude which represents the permissable fine tuning range. The tuning voltage V is a summation of $Y_o$ and $C_o''$ and is the voltage actually applied to the tuner of the television receiver.

Figure 5:
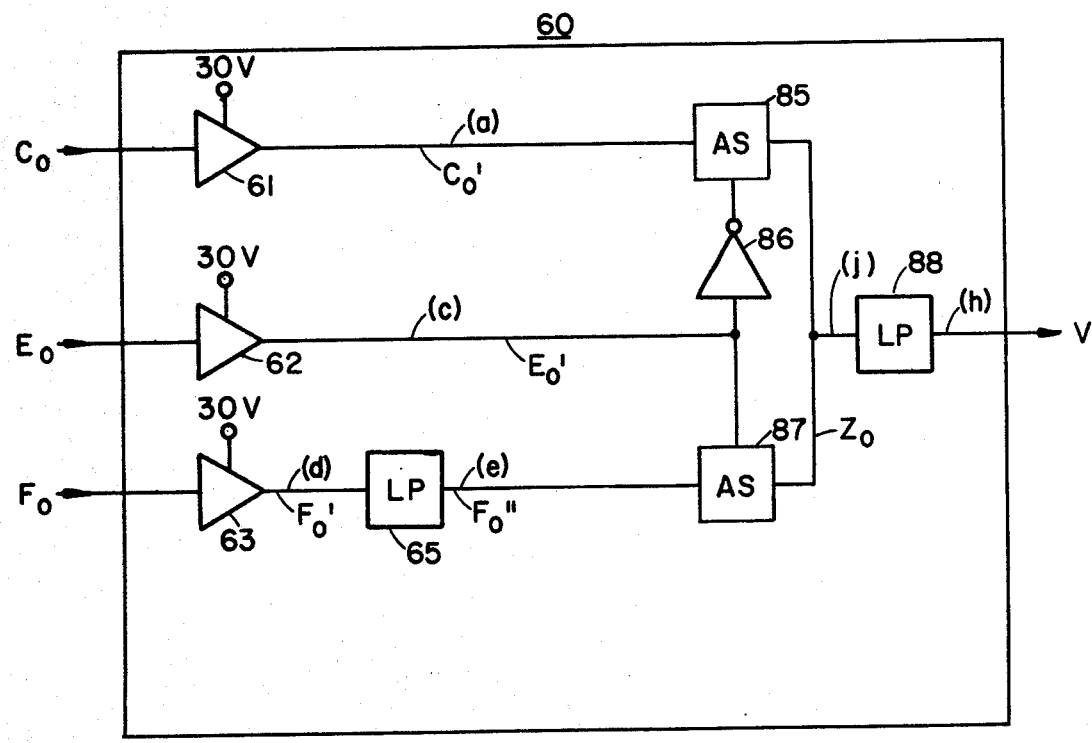

FIG. 5 represents another implementation of tuning voltage generator 60. The $C_o$, $E_o$ and $F_o$ signals are amplified by amplifiers 61, 62 and 63 as described with reference to FIG. 4. The $C_o'$ signal is supplied to a conventional analog switch 85. The $E_o'$ is applied through an inverter 86 to analog switch 85. $F_o'$ is supplied to a low pass filter 65 to produce a filtered $F_o''$ signal which is applied to an analog switch 87. $E_o'$ is coupled directly to analog switch 87. The $E_o'$ signal functions as a gate to the analog switches. When it is high (30 volts) it allows $F_o''$ to go through analog switch 87 (and closes analog switch 85) and when low allows $C_o'$ to go through analog switch 85 (and closes analog switch 87) the outputs of analog switches 85 and 87 are combined and applied to a low pass filter 88 which produces the final tuning voltage V shown as waveform (h).

Figure 7:
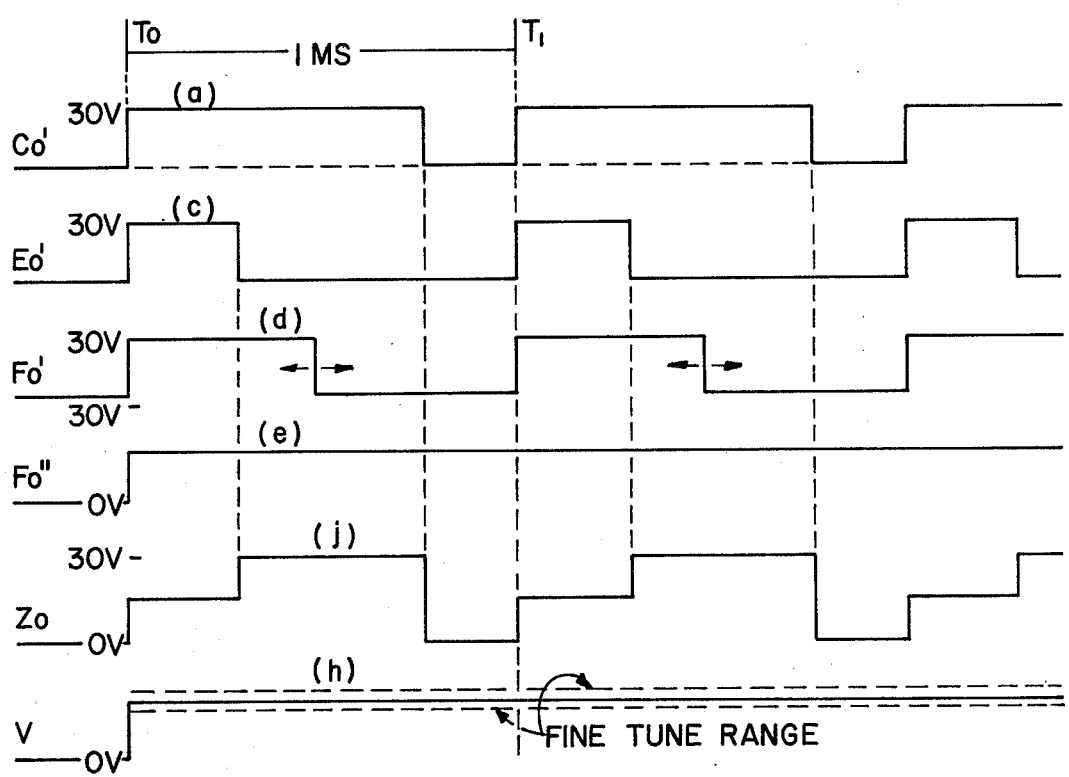

The $C_o'$, $E_o'$, $F_o'$ and $F_o''$ waveforms of FIG. 7 are identical to those in FIG. 6. Waveform $Z_o$ represents a combination of $C_o'$ and $F_o''$ and when filtered produces the actual V tuning voltage which is identical to V produced by FIG. 5 implementation.

The illustration of these two tuning voltage generators should show clearly the functional aspects involved. It will be obvious to those skilled in the art that other implementations may readily be used. The particular arrangements are believed well within the scope of the art and are not considered a part of the invention. The only criterion is that the first tuning voltage be combined with the second tuning voltage-after the second tuning voltage has been multiplied by the slope factor-to produce equal effect tuning.

Figure 8A:
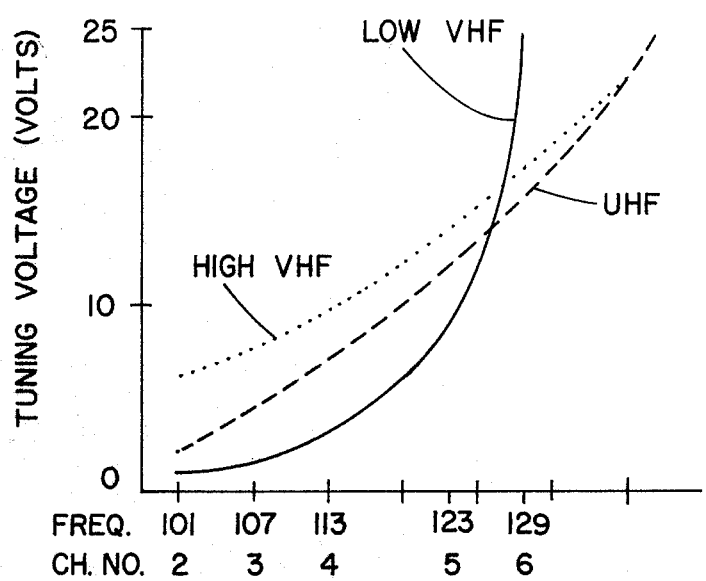
FIG. 8 shows typical tuning curves and slopes thereof for the VHF and UHF bands.
Figure 8B:
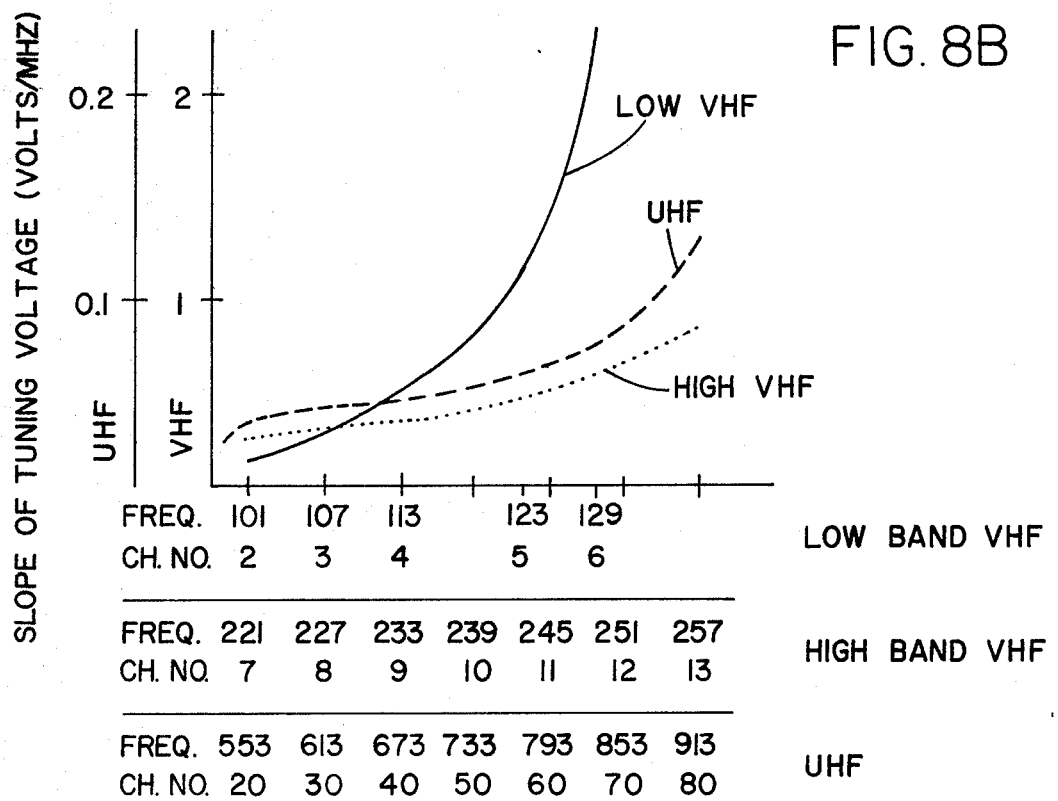

Referring to FIG. 8, two sets of curves labelled A and B are shown. Curve A is a plot of the tuning voltage along the ordinate against frequency for the VHF Lo band, VHF Hi band and UHF bands along the abscissa. Curve B is a plot of the slope of the respective curves in volts/MHz for the three bands. The VHF Lo band curves are in solid lines, the VHF Hi band curves in dotted lines and the UHF band curves are in dashed lines. These curves are useful in the following discussion determining the digital information to be stored in the various memories of FIGS. 2A and 2B. The curves are representative.

In the following analysis, the fine tune voltage counters are assumed to be set at the midpoint of their range. In this condition, they develop one-half of the fine tuning voltage available. (The magnitude of fine tuning voltage produced will, of course, depend upon the area of the tuning curve.) The nominal tuning voltage if offset from the tuning curve by the equalized contribution of the fine tuning voltage. In a zero offset system, with a ± fine tuning voltage arrangement, the nominal tuning voltage would lie on the curve. In the specification and claims the term "nominal tuning" should be understood to embrace offset systems as well as those having a fine tuning range centered on zero. Similarly, it should be obvious that the DC level of an AFC voltage coupled to the system may need to be offset.

DERIVATION OF DIGITAL INFORMATION CORRESPONDING TO NOMINAL TUNING VOLTAGE, SLOPE FACTOR AND FINE TUNING VOLTAGE n = channel number
$V_n$ = tuning voltage (volts) for n = 2→83
$a_n$ = slope of tuning characteristic (volts/MHz)
b = fine tuning range (MHz)
$V_{ss}$ = source available for tuning (volts) ≈ 30V.
$V_{ft}$ = initial fine tune voltage (volts)
$V_{ct}$ = nominal tune voltage (volts)

1. Required tuning voltage range corresponding to "b" fine tuning range for any channel n is $a_n b$ (volts).
2. Slope "$a$"$_n$ is defined by number of bit's "s" (in the assumed case s=12 bits). Therefore each count equals:

$$\frac{V_{ss}}{2^s}$$

3. The digital value to the nearest integer stored in the slope factor memories for any channel n:

$$\frac{2^s (a_n b)}{V_{ss}}$$

4. Fine tune memories have "f" bits (f=8) ∴ each count of the fine tune counters corresponds to:

$$\frac{a_n b}{2^f} \text{ (volts)}$$

5. If the fine tune counters are set at the center of the fine tune range, the counters will read:

1000 0000

6. Thus the fine tune voltage initially contributes:

$$V_{ft} = \frac{a_n b}{2} \text{ volts}$$

to the tuning voltage $V_n$.

7. Nominal tuning voltage $V_{ct}$ is defined by "c" bits (c=12) and therefore each count corresponds to:

$$\frac{V_{ss}}{2^c} \text{ volts}$$

The type of tuning voltage generator employed will determine the digital information stored in the nominal tuning voltage memory.

8. Thus $V_n$ for FIG. 4 is:

$$V_n = V_{ct} + V_{ft} = V_{ct} + \frac{a_n b}{2}$$

9. Thus $V_n$ for FIG. 5 is:

$$V_n = V_{ct} - V_{ft} = V_{ct} - \frac{a_n b}{2}$$

10. Therefore the digital information in the nominal tuning memories for FIG. 4 is:

$$\frac{2^c (V_n - \frac{a_n b}{2})}{V_{ss}}$$

11. and the digital information in the nominal tuning memories for FIG. 5 is:

$$\frac{2^c (V_n + \frac{a_n b}{2})}{V_{ss}}$$

What has been described is a method and apparatus for producing tuning equalization of a non-linear tuning curve which is especially useful in television receiver tuning system for equalized fine tuning.

While the particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. The method of compensating a non-linear bias voltage-versus-frequency characteristic of a voltage-controlled tuner to produce substantially equal frequency excursions for similar information increments comprising the steps of:
developing first information corresponding to a nominal bias voltage for a selected area of said characteristic;
developing a scale factor related to the slope of said characteristic in said area;
proportioning second information with said scale factor;
combining said first information with said proportioned second information; and
generating a tuning voltage for said tuner from said first information and said proportioned second information.

2. The method of claim 1 wherein said voltage controlled tuner is provided with memory means storing said first information and said scale factor for different areas of said characteristic, said developing step including the step of interrogating said memory means.

3. The method of claim 2 wherein said voltage controlled tuner is in a television receiver and said interrogating step is performed by using channel numbers.

4. The method of claim 3 wherein the proportioned second information is restricted to a predetermined change in frequency on said bias voltage-versus-frequency characteristic.

5. The method of claim 4 wherein said first information relates to nominal tuning of said television receiver and said second information relates to fine tuning of said television receiver.

6. The method of claim 5 wherein said memory means are electronic and have a plurality of digitally accessible channel number addresses at which said first information and said scale factor are stored.

7. In a tuning system including a voltage-controlled tuner having a non-linear bias voltage versus frequency characteristic, means for producing substantially equal frequency excursions for similar information increments comprising:
means developing first information corresponding to a nominal bias voltage for a selected area of said characteristic;
means producing a scale factor related to the slope of said characteristic in said area;
means proportioning second information with said scale factor;
means combining said first and said proportioned second information; and
means generating a tuning voltage from said combined first and proportioned second information.

8. The tuning system of claim 7, further including:
memory means storing said first information and said scale factor for different areas of said characteristic; and
means interrogating said memory means.

9. The tuning system of claim 8 wherein said tuning system is part of a television receiver capable of receiving a plurality of transmitted television signals bearing FCC allocated identifying channel numbers, and wherein said memory means are responsive to channel numbers.

10. The tuning system of claim 9 wherein said first information relates to nominal tuning of said television receiver.

11. The tuning system of claim 10 wherein said proportioned second information is limited as to the amount of frequency change that may be generated.

12. The tuning system of claim 11 wherein said frequency change corresponds to less than one channel.

13. The tuning system of claim 12 wherein said second information relates to fine tuning of said television receiver.

14. In an all-electronic television receiver including a voltage controllable tuner having a non-linear tuning voltage-versus-frequency characteristic; the method of operating said tuner to produce equalized tuning for all receivable channels comprising the steps of:
developing first tuning information indicative of a first tuning voltage for a selected channel;
proportioning second tuning information with a scale factor related to the slope of said tuning voltage characteristic in the vicinity of said selected channel and indicative of a second tuning voltage; and
generating the tuning voltage for said tuner from said first tuning information and said proportioned second tuning information.

15. The method of claim 14 wherein said first tuning information relates to a nominal tuning voltage corresponding to said selected channel, further including a memory, accessible by channel number, storing said first tuning information and said scaling factor and including the further step of:
addressing said memory with channel numbers to yield information about the nominal tuning voltage and scale factor corresponding to the selected channel.

16. The method of claim 15 wherein said memory means includes alterable fine tuning memory means, including the further step of:
altering said fine tuning memory means for change in said second proportioned tuning information in accordance with viewer preferences.

17. A television receiver including a voltage-controlled tuner for tuning to any of a plurality of channels in a television band with equal ease and effect comprising:
first means developing first tuning information indicative of a first tuning voltage for the selected one of said plurality of channels;
scaling means producing a scale factor related to the slope of the tuning voltage-frequency curve of said tuner in the region of said selected channel;
second means proportioning second tuning information with said scale factor, indicative of a second tuning voltage for said selected channel; and
means producing a tuning voltage for said tuner from said first tuning information and the proportioned second tuning information.

18. The television receiver of claim 17, further including:
memory means for storing said first tuning information and said scale factor; and
means accessing said memory means with channel numbers.

19. The television receiver of claim 18 wherein said means producing a tuning voltage include means combining said first tuning information and said proportioned second tuning information.

20. The television receiver of claim 19 wherein said second means are restricted in the amount of frequency change affected.

21. The television receiver of claim 20 wherein said amount of frequency change corresponds to less than a one channel deviation.

22. The television receiver of claim 21 wherein said second tuning information corresponds to fine tuning of said receiver.

* * * * *